(12) United States Patent
Kato

(10) Patent No.: US 6,502,227 B1
(45) Date of Patent: Dec. 31, 2002

(54) LSI DESIGN METHOD WHICH NEVER PRODUCES TIMING ERROR HAVING INFLUENCE ON ENTIRE SPECIFICATION OF LSI FUNCTION, AFTER DESIGN OF LAYOUT AND CIRCUIT OF DETAILED PORTION

(75) Inventor: Fumiyasu Kato, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/518,906

(22) Filed: Mar. 3, 2000

(30) Foreign Application Priority Data

Mar. 23, 1999 (JP) .......................................... 11-077482

(51) Int. Cl.[7] .............................................. G06F 17/50
(52) U.S. Cl. ..................... 716/10; 716/6; 716/11
(58) Field of Search ................. 716/1, 2, 3, 4, 716/5, 6, 7, 8, 9, 10, 11, 12, 13, 14, 15, 16, 17, 18; 703/14, 19

(56) References Cited

U.S. PATENT DOCUMENTS 5,475,607 A * 12/1995 Apte et al. .................. 716/10
5,572,436 A * 11/1996 Dangelo et al. ............. 703/13
5,654,898 A * 8/1997 Roetcisoender et al. ....... 716/6
5,726,903 A * 3/1998 Kezman et al. ............... 716/2
5,764,532 A * 6/1998 Patel ........................... 716/6
5,841,663 A * 11/1998 Sharma et al. ............... 716/18
5,963,730 A * 10/1999 Toyonaga et al. ............ 716/18
6,131,182 A * 10/2000 Beakes et al. ............... 716/12
6,145,117 A * 11/2000 Eng ............................. 716/18
6,298,319 B1 * 10/2001 Heile et al. ................. 703/26

FOREIGN PATENT DOCUMENTS

| JP | 5-197774 | 8/1993 |
| JP | 5-303609 | 11/1993 |
| JP | 9-153084 | 6/1997 |
| JP | 10-135339 | 5/1998 |
| JP | 10-171857 | 6/1998 |
| JP | 11-8309 | 1/1999 |

* cited by examiner

Primary Examiner—Matthew Smith
Assistant Examiner—Paul Dinh
(74) Attorney, Agent, or Firm—Choate, Hall & Stewart

(57) ABSTRACT

An LSI design method includes (a) performing an arrangement wiring on a plurality of macro blocks, (b) performing a timing analysis on the plurality of macro blocks based on the result of the arrangement wiring, and (c) designing an inside portion of each of the plurality of macro blocks based on the result of the timing analysis.

12 Claims, 11 Drawing Sheets

LSI DESIGN METHOD WHICH NEVER PRODUCES TIMING ERROR HAVING INFLUENCE ON ENTIRE SPECIFICATION OF LSI FUNCTION, AFTER DESIGN OF LAYOUT AND CIRCUIT OF DETAILED PORTION

BACKGROUND OF THE INVENTION

1. Field of the Invention

The present invention relates to an LSI design method including a plurality of macro blocks. More particularly, the present invention relates to an LSI design method, which never produces a timing error having influence on an entire specification of an LSI function, after design of a layout and a circuit of detailed portions.

2. Description of the Related Art

A conventional LSI design method including a plurality of macro blocks is described with reference to attached drawings. FIG. 1 is a flowchart showing a flow of the conventional LSI design method.

At first, in an LSI function specification determining step 21, a function specification to be defined as the LSI is determined. Next, the function specification is divided into a plurality of function modules. Then, in a function module designing step 22, all the function modules of the LSI are designed.

Next, in a layout step 23, a mask layout on the entire LSI is performed. Moreover, in a timing analysis step 24, a timing analysis as to whether or not the layout circuit satisfies a desirable timing specification is performed based on the layout result.

As a result of the timing analysis, if the desirable timing is not obtained and a timing error is brought about, the operational flow returns back to any one of the LSI function specification determining step 21, the function module designing step 22 and the layout step 23, on the basis of content of the timing error. Again, the design is tried.

In the above-mentioned conventional LSI design method, the timing analysis 24 between the function modules or a delay analysis can not be performed, unless the layout 23 for the entire LSI is executed after completion of all the function module designs 22. If the timing error occurs at the timing analysis step 24, the operational flow returns back to any one of the LSI function specification determining step 21, the function module designing step 22 and the layout step 23, on the basis of the content of the timing error. Again, the design is tried.

Especially, if the timing error can not be solved only by retrying the layout 23 or the function module design 22 and further the review of the timing of the entire system is required and thereby the LSI function specification determination 21 must be retried, the design must be retried from the original stage, at the final stage of the LSI design. Thus, this results in the large retrial, and also leads to the increase of a design time.

Japanese Laid Open Patent Application (JP-A-Heisei-5-197774) discloses the following method of modifying a circuit. A circuit generator having a high level synthesizer which receives an operational specification and prepares an inner representation based on its specification is provided with an input output interface device, an analysis modification managing device and a synthesis modification executing device. The synthesis modification executing device prepares a floor plan of a circuit based on the input operational specification, and checks it based on a constraint item. If there is a violation, the analysis modification managing device analyzes it, and outputs a modification plan.

Japanese Laid Open Patent Application (JP-A-Heisei 9-153084) discloses the following method of automatically designing LSI. After an input of a net list between function macros, a schematic layout process for the function macro is done based on this net list, and a physical specification of the function macro is determined on the basis of the schematic layout. Then, a logically synthesizing process is done based on the determined physical specification, and the layout is performed on the logic obtained from the logical synthesis, based on the schematic layout of the function macro. Thus, the retrial of the circuit synthesis and the like can be extremely reduced by watching out the layout from a stage of a function design for upper layer in which a gate level is not determined. Hence, it is possible to complete the layout design of LSI, in which a delay time and an area of the LSI are optimal, in a short time.

Japanese Laid Open Patent Application (JP-A-Heisei 10-171857) discloses the following method of designing an integrated circuit. Various modules usable as components of design target are registered as parameterized models. Database is prepared in advance for accumulating therein an instance generation information indicative of a procedure of generating an instance for the various modules and an index calculation information indicative of a manner of calculating a design quality index for each abstract. Then, this database is used to design the orientation of a floor plan. That is, also in a high level of an operational level and an RT level, the design quality indexes of the various modules used for the design are calculated by using the database. Then, they are used to execute the floor plan. In accordance with the execution result, the design quality indexes of a circuit size, a delay time and a consumption power of the design target and the like are calculated to accordingly judge whether or not the change of the design is required (whether or not the design specification is satisfied).

SUMMARY OF THE INVENTION

The present invention has been made to solve the above-described problems of the conventional LSI design method. An object of the present invention is to provide an LSI design method of performing a timing analysis at an early stage of LSI design to avoid an occurrence of large retry. Another object of the present invention is to perform a timing analysis on an entire LSI before designing an RT (Register Transfer) level of a function module to avoid the change of the specification, the change of the circuit and the re-layout of the entire LSI resulting from a timing error immediately before the end of the LSI design.

In order to achieve an aspect of the present invention, an LSI design method, includes (a) performing an arrangement wiring on a plurality of macro blocks, (b) performing a timing analysis on the plurality of macro blocks based on the result of the (a) step, and (c) designing an inside portion of each of the plurality of macro blocks based on the result of the (b) step.

In this case, the (b) step includes performing the timing analysis in consideration of a wiring capacitance and a wiring resistor corresponding to the result of the (a) step.

Also in this case, the (c) step includes performing a register transfer level design, a circuit design and a layout design on the inside portions such that the plurality of macro blocks satisfy timing restrictions corresponding to the result of the (b) step, the timing restrictions being given to the plurality of macro blocks.

Further in this case, the (c) step includes performing, after performing the register transfer level design, the circuit design and the layout design on the inside portions as a specific performing, performing a second timing analysis whether the plurality of macro blocks satisfy the timing restrictions based on the result of the specific performing, and performing one of the register transfer level design, the circuit design and the layout design on the inside portions again, when the timing restrictions are not satisfied as the result of the second timing analysis.

In this case, an LSI design method further includes (d) determining a function specification of an LSI, (e) dividing the LSI into the plurality of macro blocks based on the function specification, and (f) determining a size and a shape of each of the plurality of macro blocks to perform a floor plan on an entire portion of the LSI, and wherein the (d), (e), and (f) steps are performed before the (a) step is performed.

Also in this case, when a predetermined timing restriction is not satisfied as the result of the (b) step, at least one of the (d), (e) and (f) steps is performed again.

Further in this case, at least one of the plurality of the macro blocks is a macro block, as a post-designed macro block, of which a design is performed, and the (c) step includes designing the inside portion of one other than the post-designed macro block of the plurality of macro blocks.

In order to achieve another aspect of the present invention, an LSI design method, includes (g) performing a function specification design of an LSI, (h) performing an arrangement wiring on a plurality of macro blocks for the LSI based on the result of (g) step, (i) performing a timing analysis on the plurality of macro blocks based on the result of (h) step, (j) performing a design and a wiring on an inside portion of each of the plurality of macro blocks based on the result of (i) step, (k) performing a arrangement on the plurality of macro blocks for the LSI without performing a wiring on the plurality of macro blocks based on the result of (g) step, (l) performing a design on an inside portion of each of the plurality of macro blocks, (m) performing a first wiring between the plurality of macro blocks and a second wiring on the inside portion of each of the plurality of macro blocks after the (k) and (l) steps are performed, wherein the first and second wirings are performed at a same time to each other, and (n) performing a timing analysis on the plurality of macro blocks after the (m) step is performed, and wherein a first LSI design process includes the (h), (i) and (j) steps and a second LSI design process includes the (k), (l), (m) and (n) steps, and one of the first and second design processes is performed selectively.

In this case, the first design process is performed selectively when the LSI is a LSI in which a timing required is more critical than a predetermined value as the result of the (g) step.

Also in this case, the first design process is performed selectively when a circuit size of the LSI is larger than a predetermined size, as the result of the (g) step.

Further in this case, the second design process is performed selectively when a layout density of the LSI is larger than a predetermined density, as the result of the (g) step.

In order achieve still another aspect of the present invention, an LSI design method, includes (o) performing a floor plan on a plurality of macro blocks for an LSI, (p) performing an arrangement on the plurality of macro blocks, (q) performing a wiring on the plurality of macro blocks, (r) performing a timing analysis on the plurality of macro blocks based on the result of the (q) step to perform a design and a wiring on an inside portion of each of the plurality of macro blocks based on the timing analysis when the wiring as the result of the (q) step fits into a predetermined chip size, and (s) removing the wiring as the result of the (q) step and performing a first wiring between the plurality of macro blocks and a second wiring on the inside portion of each of the plurality of macro blocks, wherein the first and second wirings are performed at a same time after performing a design of the inside portion of each of the plurality of macro blocks when the wiring as the result of the (q) step does not fit into the predetermined chip size.

In order achieve yet still another aspect of the present invention, an LSI design apparatus, includes a first section performing an arrangement wiring on a plurality of macro blocks, a second section performing a timing analysis on the plurality of macro blocks based on the result of the arrangement wiring, and a third section designing an inside portion of each of the plurality of macro blocks based on the result of the timing analysis.

In this case, the second section performs the timing analysis in consideration of a wiring capacitance and a wiring resistor corresponding to the result of the arrangement wiring.

Also in this case, the third section performs a register transfer level design, a circuit design and a layout design on the inside portions such that the plurality of macro blocks satisfy timing restrictions corresponding to the result of the timing analysis, the timing restrictions being given to the plurality of macro blocks.

Further in this case, the third section performs, after performing the register transfer level design, the circuit design and the layout design on the inside portions as a specific performing, a second timing analysis whether the plurality of macro blocks satisfy the timing restrictions based on the result of the specific performing, and performs one of the register transfer level design, the circuit design and the layout design on the inside portions again, when the timing restrictions are not satisfied as the result of the second timing analysis.

In this case, an LSI design apparatus, further includes a fourth section determines a function specification of an LSI, a fifth section divides the LSI into the plurality of macro blocks based on the function specification, and a sixth section determining a size and a shape of each of the plurality of macro blocks to perform a floor plan on an entire portion of the LSI, and wherein the operations of the fourth, fifth, and sixth sections are performed before the operation of the first section is performed.

Also in this case, when a predetermined timing restriction is not satisfied as the result of the operation of the second section, at least one of the operations of the fourth, fifth and sixth sections is performed again.

Further in this case, at least one of the plurality of the macro blocks is a macro block, as a post-designed macro block, of which a design is performed, and the third section designs the inside portion of one other than the post-designed macro block of the plurality of macro blocks.

In order to achieve another aspect of the present invention, an LSI design apparatus, includes a first unit performing a function specification design of an LSI, a second unit performing an arrangement wiring on a plurality of macro blocks for the LSI based on the result of the operation of the first unit, a third unit performing a timing analysis on the plurality of macro blocks based on the result of the operation of the second unit, a fourth unit performing a design and a wiring on an inside portion of each of the plurality of macro blocks based on the result of the operation of the third unit, a fifth unit performing a arrangement on the plurality of macro blocks for the LSI without performing a wiring on the plurality of macro blocks based on the result of the operation of the first unit, a sixth unit performing a design on an inside portion of each of the plurality of macro blocks, a seventh unit performing a first wiring between the plurality of macro blocks and a second wiring on the inside portion of each of the plurality of macro blocks after the operations of the fifth and sixth units are performed, wherein the first and second wirings are performed at a same time to each other, and a eighth unit performing a timing analysis on the plurality of macro blocks after the operation of the seventh unit is performed, and wherein a first LSI design process unit includes the second, third and fourth units and a second LSI design process unit includes the fifth, sixth, seventh and eighth units, and one of the first and second design process units performs selectively.

In order to achieve still another aspect of the present invention, an LSI design apparatus, includes a floor plan unit performing a floor plan on a plurality of macro blocks for an LSI, a arrangement unit performing an arrangement on the plurality of macro blocks, a wiring unit performing a wiring on the plurality of macro blocks, a timing analysis unit performing a timing analysis on the plurality of macro blocks based on the wiring to perform a design and a wiring on an inside portion of each of the plurality of macro blocks based on the timing analysis when the wiring fits into a predetermined chip size, and a removing unit removing the wiring and performing a first wiring between the plurality of macro blocks and a second wiring on the inside portion of each of the plurality of macro blocks, wherein the first and second wirings are performed at a same time after performing a design of the inside portion of each of the plurality of macro blocks when the wiring does not fit into the predetermined chip size.

In order to achieve yet still another aspect of the present invention, a computer readable recording medium for recording a program for a process, includes (t) performing an arrangement wiring on a plurality of macro blocks, (u) performing a timing analysis on the plurality of macro blocks based on the result of the arrangement wiring, and (v) designing an inside portion of each of the plurality of macro blocks based on the result of the timing analysis.

An LSI design method in the present invention, in an LSI design method including a plurality of macro blocks, comprises: a step of performing an arrangement wiring on a plurality of macro blocks; a step of performing a timing analysis between the plurality of macro blocks based on the result of the arrangement wiring; and a step of designing the inside of the macro block based on the result of the timing analysis.

Another LSI design method in the present invention, in an LSI design method including a plurality of macro blocks, selects between a first LSI design method includes: a step of performing an arrangement wiring on a plurality of macro blocks; a step of performing a timing analysis between the plurality of macro blocks based on the result of the arrangement wiring; and a step of wiring the inside of the macro block based on the result of the timing analysis, and a second LSI design method includes: a step of performing only an arrangement without wiring a plurality of macro blocks; a step of designing the inside of the macro block; a step of performing only arrangement on the macro block; a step of designing the inside of the macro block, and a step of simultaneously performing the wiring between the macro blocks and the wiring within the macro block after the above-mentioned steps; and a step of performing a timing analysis after the wiring step, based on a function specification of the LSI.

Still another LSI design method in the present invention, in an LSI design method of performing a layout so that a plurality of macro blocks are mounted in a predetermined chip size, determines a floor plan for each of the plurality of macro blocks, and performs the arrangement between the macro blocks and the wiring between the macro blocks. If the wiring between the macro blocks is accommodated in the predetermined chip size, a timing analysis between the plurality of macro blocks is performed based on the result of the wiring between the macro blocks, and the inner design of the macro block and the inner wiring of the macro block are performed based on the result of the timing analysis. If the wiring between the macro blocks is not accommodated in the predetermined chip size, the wiring between the blocks is stripped off. Then, the wiring between the macro blocks and the inner wiring of the macro block are simultaneously performed after the completion of the inner design of the macro block.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail.

Figure 1:
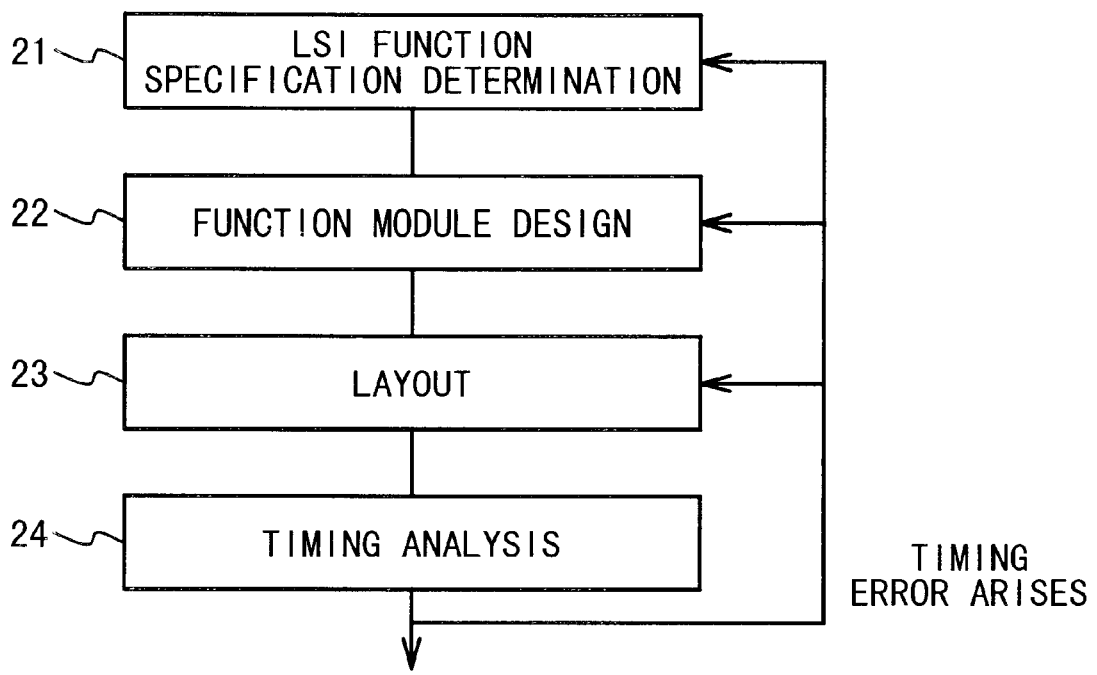
FIG. 1 is a flowchart showing a conventional process flow.
Figure 2:
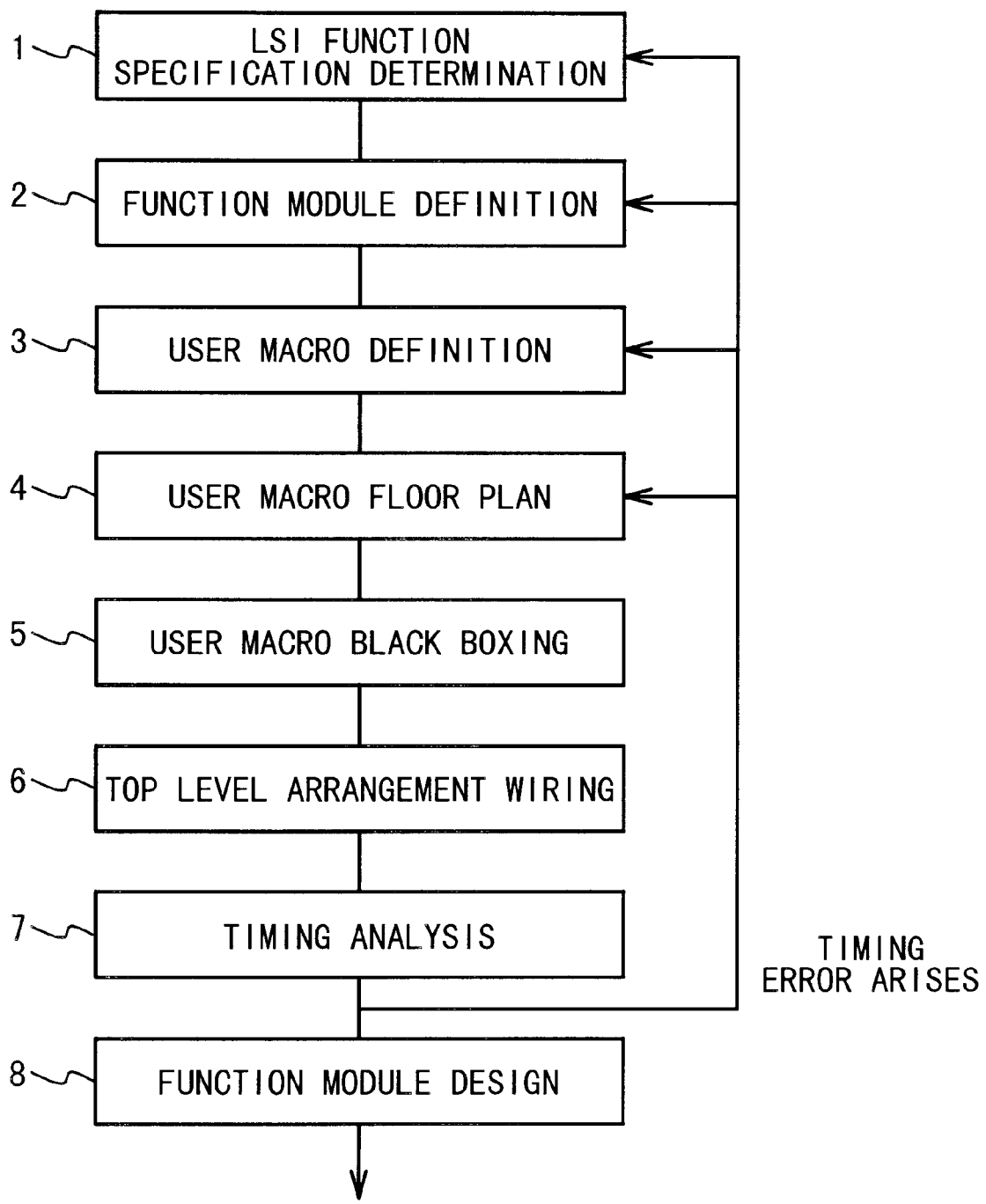
FIG. 2 is a flowchart showing a process flow of a first embodiment.

A first embodiment of the present invention will be described below with reference to the attached drawings. FIG. 2 is a flowchart showing a process flow of the first embodiment. In a design method of this embodiment, respective steps of an LSI function specification determination 1, a function module definition 2, a user macro definition 3, a user macro floor plan 4, a user macro black boxing 5, a top level arrangement wiring 6, a timing analysis 7 and a function module design 8 are performed in the above-mentioned order.

In this embodiment, layout is performed such that LSI of one chip is divided into a plurality of macro blocks. A macro block serving as a unit of this layout is referred to as a user macro, in this embodiment.

The operation of the first embodiment will be described below with reference to FIGS. 4 to 8.

Figure 4:
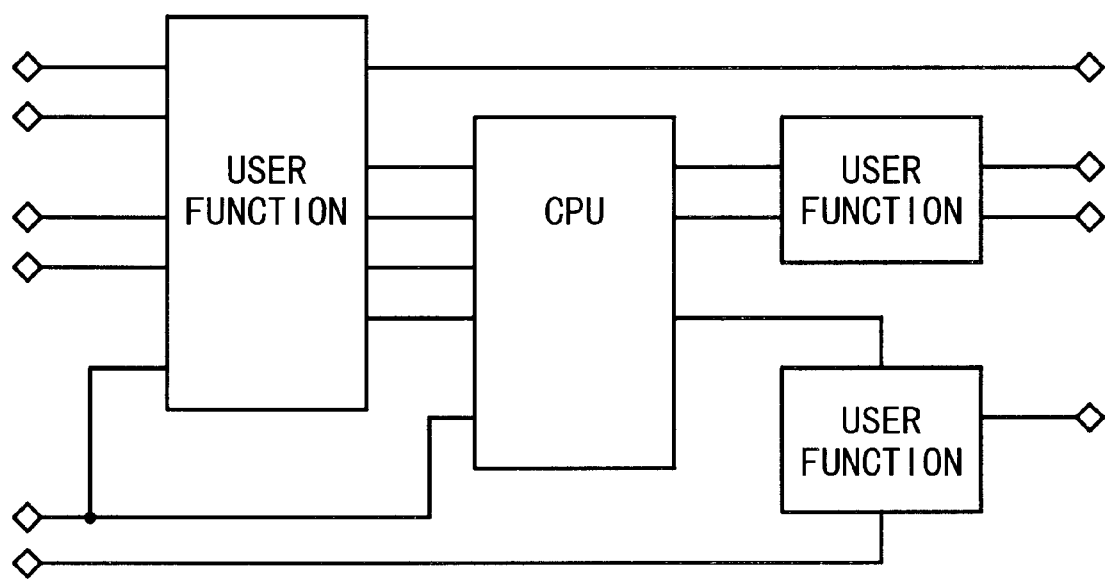
FIG. 4 is a block diagram of LSI after determination of a function specification in the fist and second embodiments.

In the LSI function specification determining step 1 of FIG. 2, the specification of LSI targeted for the design is determined, as shown in FIG. 4. This specification determination corresponds to the determination of a block diagram of the LSI. In the specification determination, the input and output interfaces of functions installed in the LSI are defined, and the connection relation between the respective functions of the entire LSI is determined.

Figure 5:
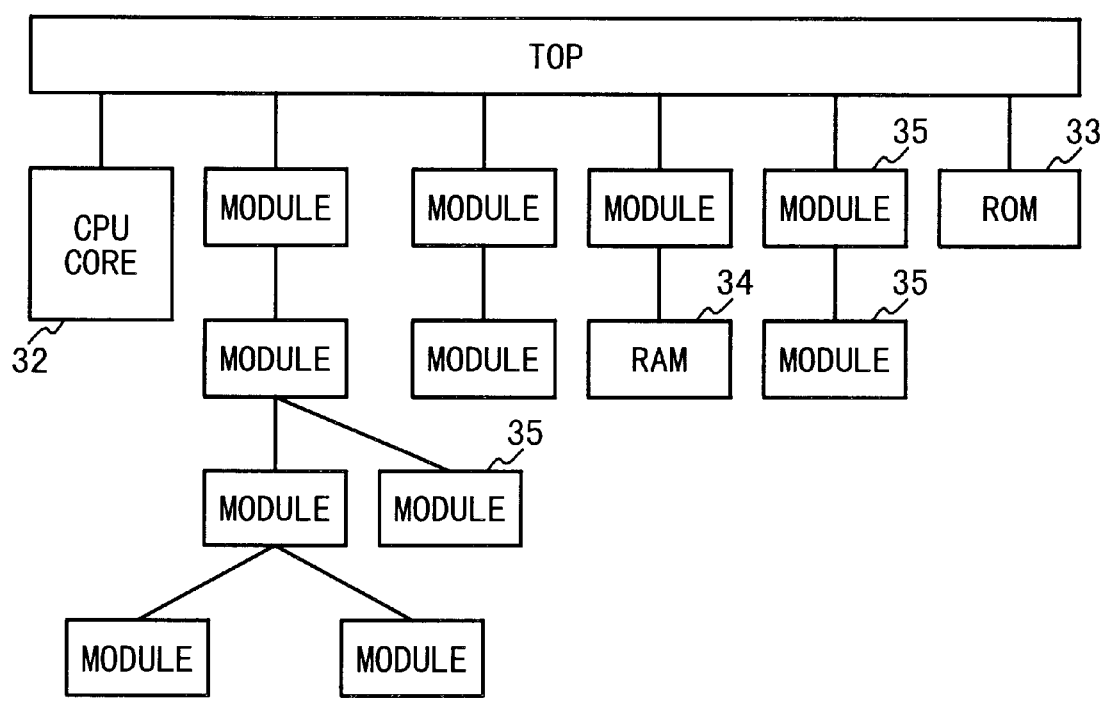
FIG. 5 is a design hierarchy of LSI immediately after definition of a function module in the first and second embodiments.

Next, in the function module defining step 2 of FIG. 2, the unit of execution of a logical verification or a timing verification is defined as a function module, as shown in FIG. 5. In the function module defining step 2, a function module configuration in which the LSI is represented as a net list is defined. At this stage, it is not necessary to perfectly end the design of the function module. It is enough to at least make signals serving as the input and output of the function module evident.

In this embodiment, a CPU core 32, a ROM 33 and a RAM 34 among the function modules of FIG. 5 are the function modules in which the layouts are already completed, respectively. The other function modules 35 are the function modules in which only input and output signals are determined and further the inner designs are necessary, respectively.

Figure 6:
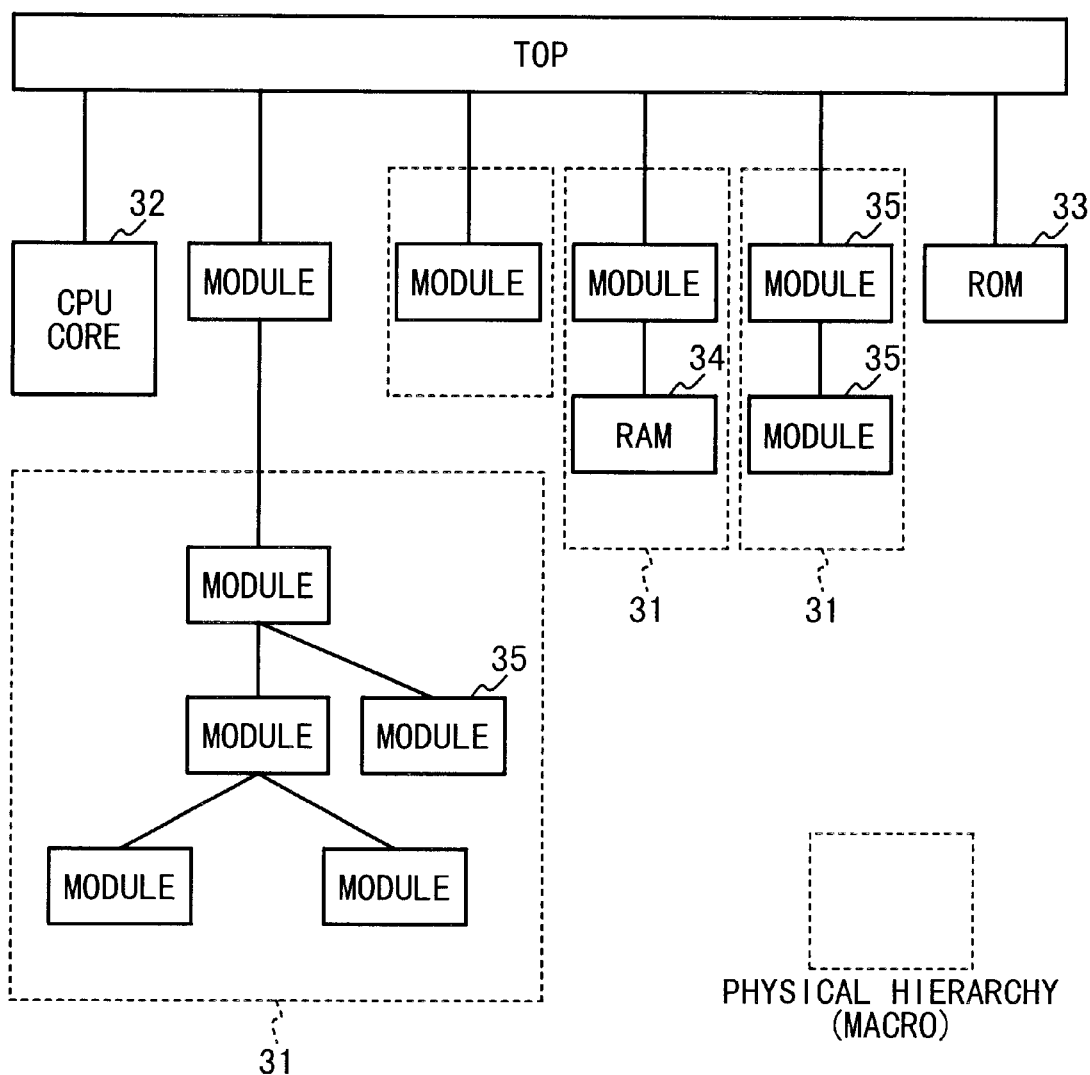
FIG. 6 is a design hierarchy of LSI immediately after definition of a user macro in the first and second embodiments.

In the user macro defining step 3 of FIG. 2, a user macro as an individual layout object is defined, as shown in FIG. 6. A plurality of the user macros are represented as a net list. In the user macro defining step 3, one or a plurality of function modules 34, 35 surrounded with a dashed line in FIG. 6 constitute a single user macro 31 in consideration of an actual mask layout.

Figure 7:
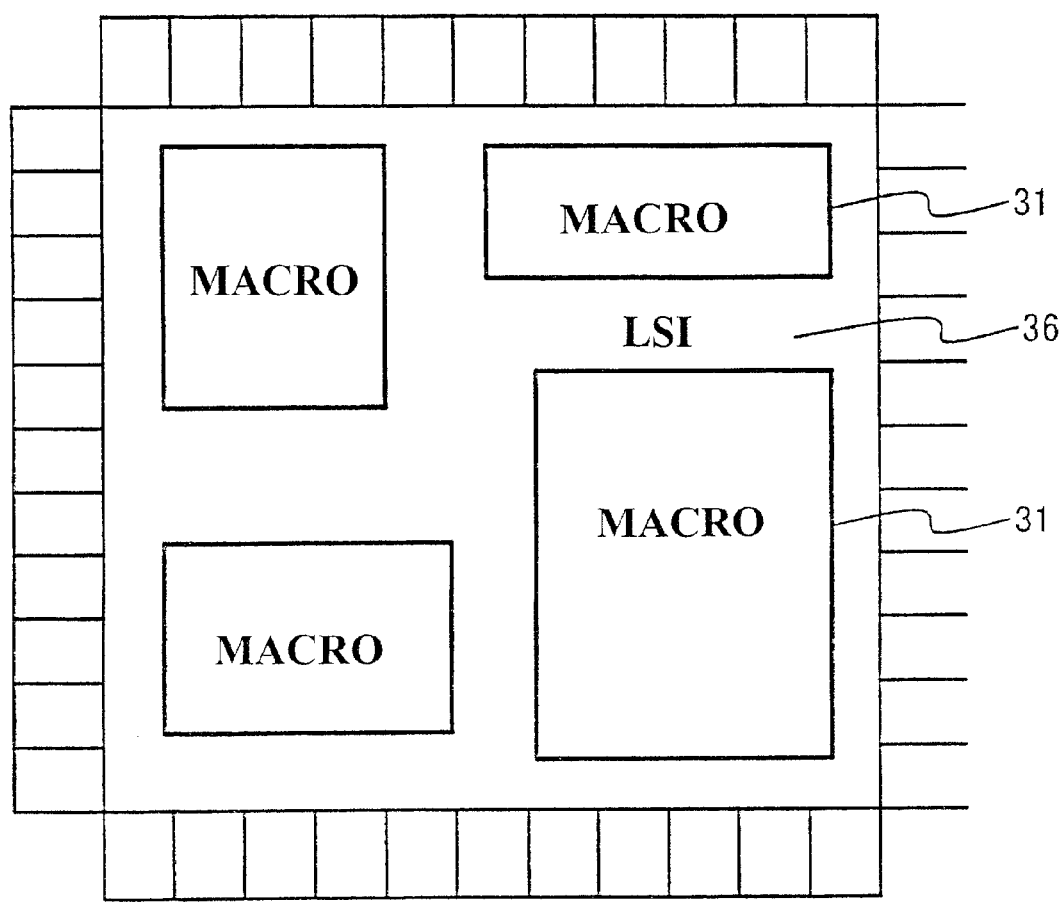
FIG. 7 is a layout image of LSI immediately after a user macro floor plan in the first and second embodiments.

Next, in the user macro floor planning step 4 of FIG. 2, a size and a shape of the user macro 31 are determined, as shown in FIG. 7. After that, an arranged position in an LSI 36 of a certain user macro 31 is determined as shown in FIG. 7.

In the user macro black boxing step 5 of FIG. 2, the circuit configuration in the user macro 31 is formed as a black box so that the arrangement wiring at a top level can be done without consideration of the inside of the user macro 31 (not shown). At this time, input and output terminals are generated which serve respectively as input and output interfaces of each user macro 31.

Figure 8:
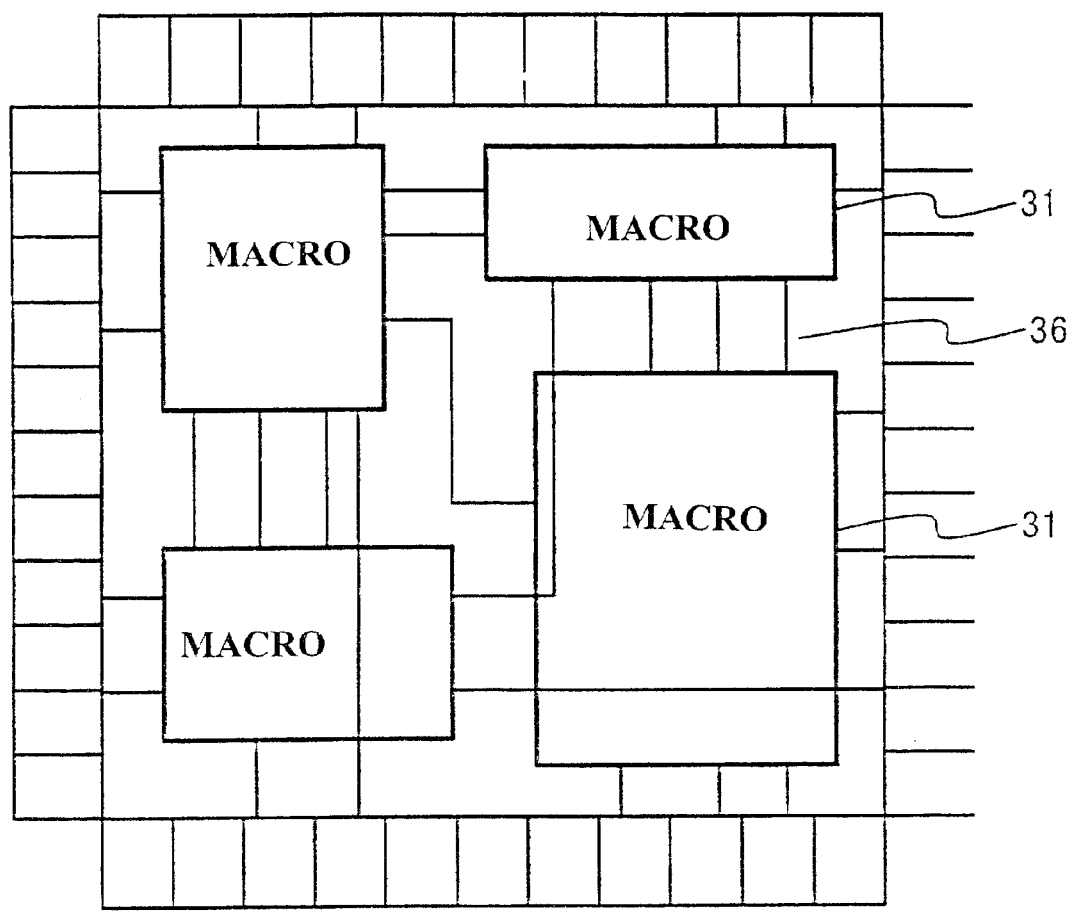
FIG. 8 is a layout image of LSI immediately after a top level arrangement wiring in the first embodiment.

In the top level arrangement wiring 6 of FIG. 2, the arrangement wiring at the top level including the user macro 31 formed as the black box is performed as shown in FIG. 8. In the top level arrangement wiring 6, if a process with regard to the layout other than the arrangement wiring is necessary, the process is performed altogether.

In the timing analysis step 7 of FIG. 2, the timing analysis between the user macros 31 is performed. As a result, if a timing error occurs, the operational flow returns back to any one step of the LSI function specification determination 1, the function module definition 2, the user macro definition 3 and the user macro floor plan 4. Then, the design is retried from the return step.

As the result of the timing analysis 7, for example, if the timing between the user macros 31 is severe, in the user macro floor plan 4, the floor plan is reviewed so that the user macros 31 between which the timing is severe are arranged adjacently to each other to thereby reduce the wiring delay of the wiring between the user macros 31.

If the timing error can not be solved even after the review of the floor plan in the user macro floor plan 4, the operational flow returns back to the LSI function specification determination 1. In the LSI function specification determination 1, the LSI function specification is reviewed by, for example, inserting a relay register (not shown) between the user macros 31 to reduce the delay between the registers. Accordingly, it tries to solve the timing error.

As the result of the timing analysis 7, if the timing error does not occur, or if the timing error can be solved by the re-design, the operational flow proceeds to the function module design 8.

In the function module design 8, an RTL (Register Transfer Level) design and a circuit design are performed on the function module(s) included in the user macro 31. Moreover, although not shown, a mask layout is performed on the inside of the user macro 31 after the function module design 8, and a second timing analysis is performed at a unit of the user macro 31, based on the layout result of the inside of the user macro 31. Even if a timing error occurs as a result of this second timing analysis, it brings about the return to the function module design 8, at most. The function module design 8 is done in the condition that there is no timing error as the result of the timing analysis 7 at the top level. Thus, after the function module design 8, there is no case that the operational flow returns back to the steps before the top level arrangement wiring 6.

Figure 3:
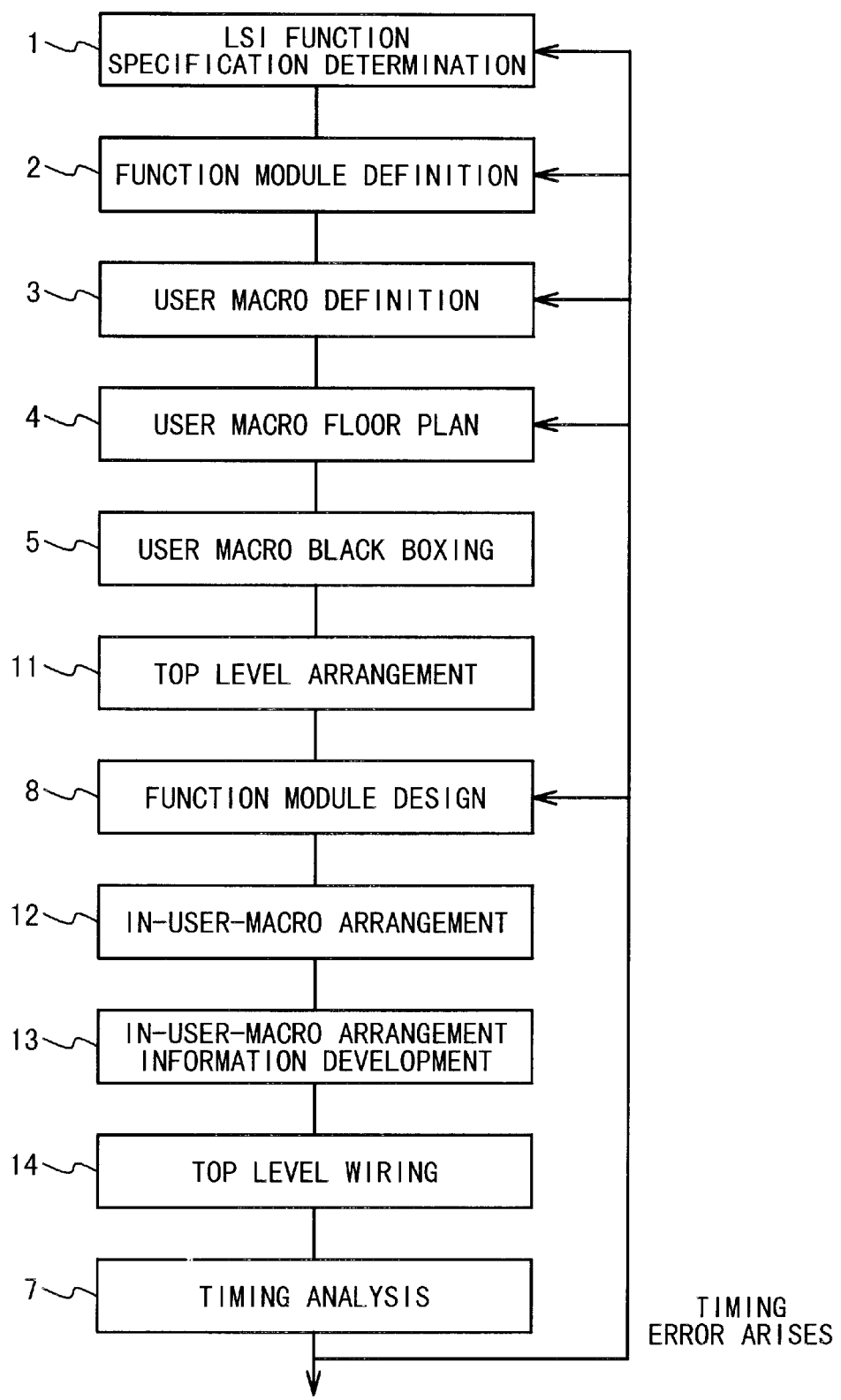
FIG. 3 is a flowchart showing a process flow of a second embodiment.

A second embodiment will be described below with reference to the drawings. FIG. 3 is a flowchart showing the process flow of the second embodiment.

In the second embodiment, steps after the user macro black boxing 5 are different from those of the first embodiment. The difference between the second embodiment and the first embodiment is that after the user macro black boxing 5, the design is done in order of a top level arrangement 11, a function module design 8, an in-user-macro arrangement 12, an in-user-macro arrangement information development 13, a top level wiring 14 and a timing analysis 7.

The operation of the second embodiment will be described below with reference to FIG. 3 and FIGS. 9 to 11. In order to avoid redundancy of explanation, the processes before the user macro black boxing 5 are not explained since their configurations and operations are substantially equal to those of the first embodiment. Then, steps after the top level arrangement 11 are explained.

As shown in FIG. 3, after the user macro black boxing 5, in the top level arrangement 11, the arrangement at the top level including the user macro 31 formed as the black boxing is performed. Differently from the top level arrangement wiring 6 of the first embodiment, in the top level arrangement 11, the wiring at the top level is not performed, and then only the arrangement is performed.

Next, in the function module design 8 of FIG. 3, the function module is designed. Here, the RTL design and the circuit design of the function module are performed based on the specification of the function module defined by the function module definition 2.

Figure 9:
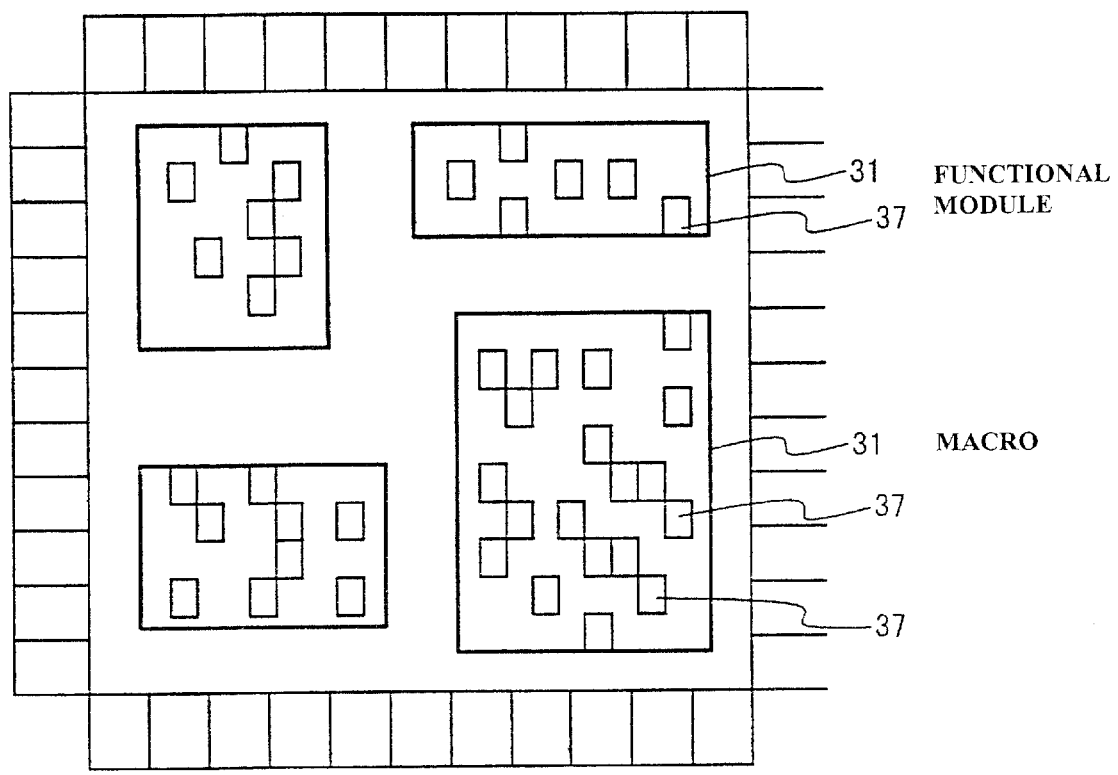
FIG. 9 is a layout image of LSI immediately after arrangement in a user macro in the second embodiment.

As shown in FIG. 9, in the in-user-macro arrangement 12, function modules 37 included in the user macro 31 are arranged in the user macro 31, based on the design result of the function module design 8.

Figure 10:
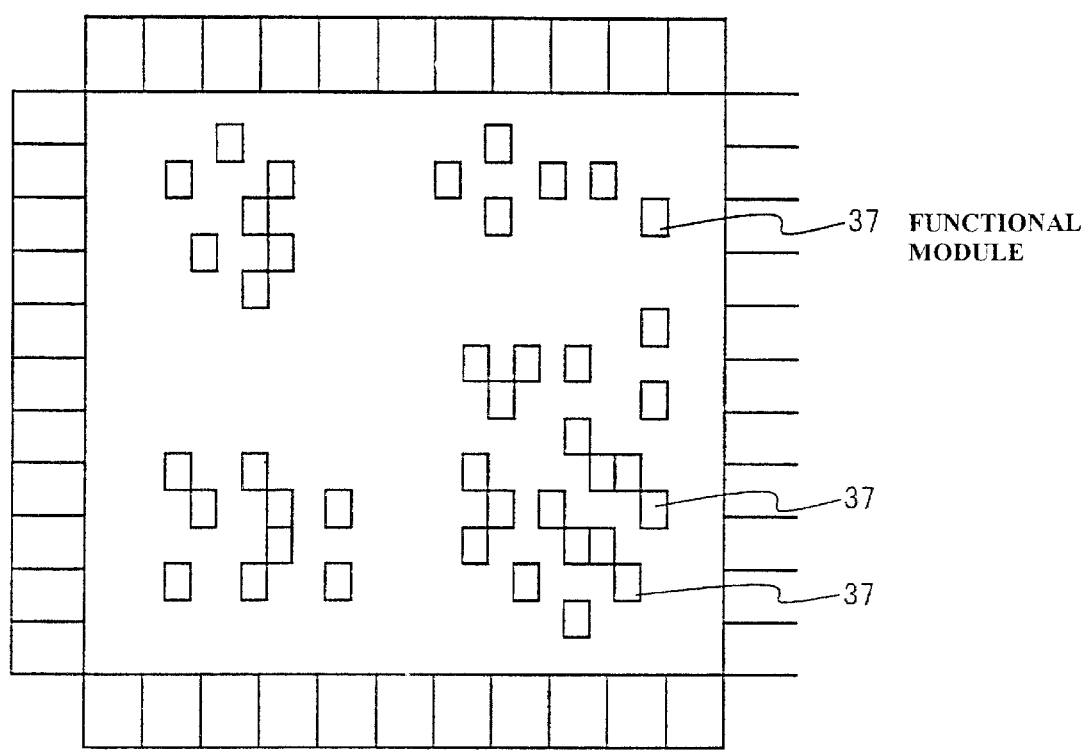
FIG. 10 is a layout image of LSI immediately after development of an arrangement information in a user macro in the second embodiment.

As shown in FIG. 10, in the in-user-macro arrangement information development 13, an arrangement information in the user macro 31 is reflected as an information of a top hierarchy.

Figure 11:
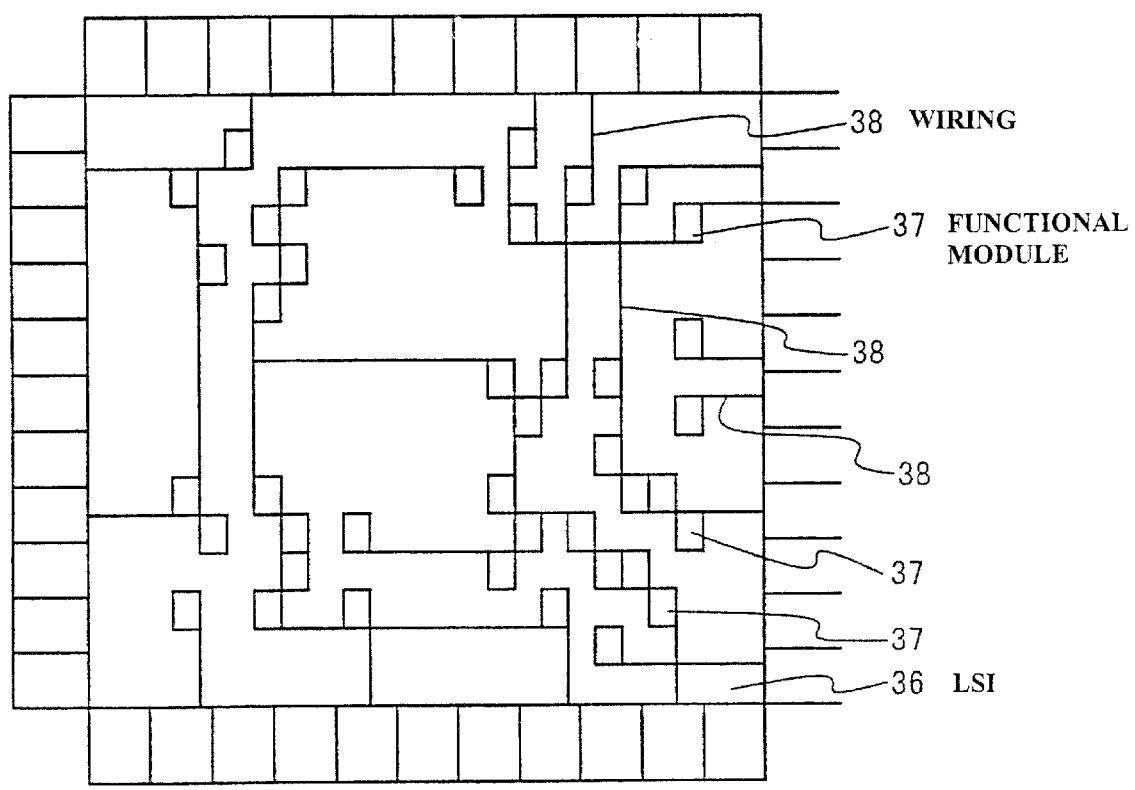
FIG. 11 is a layout image of LSI immediately after a top level wiring in the second embodiment.

In succession, as shown in FIG. 11, in the top level wiring 14, a wiring 38 is performed based on the arrangement information in the user macro 31 reflected as the information at the top hierarchy and an arrangement information at the top level. In the top level wiring 14, if a process with regard to a layout other than the wiring is needed, the process is performed altogether. In the second embodiment, the wiring at the top level and the wiring in the user macro 31 are not done for each hierarchy, differently from the first embodiment. So, the wiring at the top level and the wiring in the user macro 31 are performed at a time.

Next, in the timing analysis 7 of FIG. 3, the timing analysis is performed at one chip (LSI 36) level. As a result, if a timing error occurs, the operational flow returns back to any one step of the LSI function specification determination 1, the function module definition 2, the user macro definition 3, the user macro floor plan 4 and the function module design 8. Then, the design is retried. If the timing error is removed, the design is ended.

In the second embodiment, the timing analysis 7 at the one chip (LSI 36) level is done at a final stage of the design. This may cause the returns to the initial stage of the design, such as the LSI function specification determination 1 or the like, depending on the result of the timing analysis 7. However, the wiring at the top level and the wiring in the user macro 31 are done at the same step (the top level wiring 14). Thus, if a wiring space exists in the user macro 31, the wiring between the user macros 31 can be done by using the wiring space in the user macro 31. In this way, the second embodiment has a merit of improving a wiring density.

In accordance with the design result of the LSI function specification 1 to be attained, it is possible to select any one of the design method in the first embodiment and the design method in the second embodiment, selectively. This enables the selection of the design method optimal for the function specification of the LSI.

For example, the design method in the first embodiment is selected if a critical timing at which the LSI function to be attained is required, or if a circuit size of the LSI is large, as the result of the LSI function design determination 1. Thus, the optimal design can be done by reducing the possibility of the retrial and hierarchically advancing the design.

On the other hand, the design method in the second embodiment can be selected if a layout of a high density is required, or if a required timing is not strict and thereby the possibility of the retrial is low, or if the circuit size of the LSI is small, as the result of the LSI function design determination 1. Accordingly, the wiring space in the user macro 31 can be used to attain the layout of the high density.

Also, if the LSI design method in the first embodiment is selected and designed until the top level arrangement wiring 6 of FIG. 2 and then the wiring at the top level can not be done because of the limit of the chip size of the LSI 36, the design can be done as follows. That is, the wiring at the top level is stopped when the wiring at the top level can not be done because of the limit of the chip size of the LSI 36. Then, it is possible to switch from the top level arrangement 11 shown in FIG. 3 to the LSI design method shown in the second embodiment. Accordingly, the wiring can be accommodated in the chip size of the LSI 36, which can not be designed by the LSI design method in the first embodiment.

As mentioned above, the present invention can provide the effects noted in the following (1) to (6).

(1) The timing required of the user macro 31 at the initial stage in the LSI design, such as the LSI specification determination 1 or the like, can be made evident, which enables the design considering the timing at the stage after the design of the function modules 32, 33, 34 and 35. Thus, it is possible to avoid the change of the LSI specification, the change of the circuit and the re-layout, because of the timing error immediately before the end of the LSI design.

(2) The user macro floor plan 4 determines the size of the user macro 31 before the function module design 8 to thereby improve the estimation accuracy of the delay time in the function modules 32, 33, 34 and 35 and also improve the qualities of the timing and the delay verification.

(3) The timing information from or to the user macro 31 is determined before the function module design 8. Thus, the function module design 8 can be done which considers the timing information at a boundary between the user macros 31, at the initial stage of the function module design 8.

(4) The timing information from or to the user macro 31 is determined before the function module design 8. Thus, the function module design 8 and the layout designs of the respective user macros 31 can be done perfectly independent of each other. Hence, the layout designs of the respective function modules 32, 33, 34 and 35 and the respective user macros 31 can be done in parallel to thereby largely shorten the design time of the LSI 36.

(5) The arrangement wiring at the top level can be done at the initial stage of the LSI specification determination 1 and the LSI design. Thus, the chip size of the targeted LSI 36 can be determined at the initial stage of the LSI stage.

(6) The optimal design method can be selected depending on the function specification required of the LSI 36.

What is claimed is:

1. An LSI design method comprising:
 (a) performing an arrangement wiring on a plurality of macro blocks;
 (b) performing a timing analysis on said plurality of macro blocks based on the result of said (a) step; and
 (c) designing an inside portion of each of said plurality of macro blocks based on said result of said (b) step,
  wherein said (c) step includes performing a register transfer level design, a circuit design and a layout design on said inside portions such that said plurality of macro blocks satisfy timing restrictions corresponding to said result of said (b) step, said timing restrictions being given to said plurality of macro blocks; and
  wherein said (c) step includes performing, after performing said register transfer level design, said circuit design and said layout design on said inside portions as a specific performing, performing a second timing analysis whether said plurality of macro blocks satisfy said timing restrictions based on the result of said specific performing, and performing one of said register transfer level design, said circuit design and said layout design on said inside portions again, when said timing restrictions are not satisfied as the result of said second timing analysis.

2. An LSI design method comprising:
 (a) performing an arrangement wiring on a plurality of macro blocks;
 (b) performing a timing analysis on said plurality of macro blocks based on the result of said (a) step; and (c) designing an inside portion of each of said plurality of macro blocks based on said result of said (b) step, further comprising:

(d) determining a function specification of an LSI;

(e) dividing said LSI into said plurality of macro blocks based on said function specification; and (f) determining a size and a shape of each of said plurality of macro blocks to perform a floor plan on an entire portion of said LSI, and wherein said (d), (e), and (f) steps are performed before said (a) step is performed.

3. An LSI design method according to claim 2, wherein when a critical predetermined timing restriction is not satisfied as the result of said (b) step, at least one of said (d), (e) and (f) steps is performed again.

4. An LSI design method, comprising:

(g) performing a function specification design of an LSI;

(h) performing an arrangement wiring design on a plurality of macro blocks for said LSI based on the result of (g) step;

(i) performing a timing analysis on said plurality of macro blocks based on the result of the design of said (h) step;

(j) performing a design and a wiring on an inside portion of each of said plurality of macro blocks based on the result of the said (i) step;

(k) performing a arrangement on said plurality of macro blocks for said LSI without performing a wiring on said plurality of macro blocks based on the result of the said (g) step;

(l) performing a design on an inside portion of each of said plurality of macro blocks;

(m) performing a first wiring between said plurality of macro blocks and a second wiring on said inside portion of each of said plurality of macro blocks after said (k) and (l) steps are performed, wherein said first and second wirings are performed at a same time to each other; and (n) performing a timing analysis on said plurality of macro blocks after said (m) step is performed, and wherein a first LSI design process includes said (h), (i) and (j) steps and a second LSI design process includes said (k), (l), (m) and (n) steps, and one of said first and second design processes is performed selectively.

5. An LSI design method according to claim 4, wherein said first design process is performed selectively when said LSI is a LSI in which a timing that is required is more critical than a predetermined value as the result of said (g) step.

6. An LSI design method according to claim 4, wherein said first design process is performed selectively when a circuit size of said LSI is larger than a predetermined allowable circuit size, as the result of said (g) step.

7. An LSI design method according to claim 4, wherein said second design process is performed selectively when a layout density of said LSI is larger than a predetermined allowable circuit density, as the result of said (g) step.

8. An LSI design method, comprising:

(o) performing a floor plan on a plurality of macro blocks for an LSI;

(p) performing an arrangement on said plurality of macro blocks;

(q) performing a preliminary wiring simulation on said plurality of macro blocks;

(r) performing a timing analysis on said plurality of macro blocks based on the result of the (q) step to perform a design and a wiring on an inside portion of each of said plurality of macro blocks based on said timing analysis when the wiring as said result of said (q) step fits into a predetermined chip size; and (s) deleting said wiring as said result of said (q) step and performing a first wiring between said plurality of macro blocks and a second wiring on said inside portion of each of said plurality of macro blocks, wherein said first and second wirings are performed at a same time after performing a design of said inside portion of each of said plurality of macro blocks when said wiring as said result of said (q) step does not fit into said predetermined chip size.

9. An LSI design apparatus comprising:

a first section performing an arrangement wiring on a plurality of macro blocks;

a second section performing a timing analysis on said plurality of macro blocks based on the result of said arrangement wiring; and a third section designing an inside portion of each of said plurality of macro blocks based on said result of said timing analysis, wherein said third section performs a register transfer level design, a circuit design and a layout design on said inside portions such that said plurality of macro blocks satisfy timing restrictions corresponding to said result of said timing analysis, said timing restrictions being given to said plurality of macro blocks, wherein said third section performs, after performing said register transfer level design, said circuit design and said layout design on said inside portions as a specific performing incident, a second timing analysis as to whether said plurality of macro blocks satisfy said timing restrictions based on the result of said specific performing incident, and performs one of said register transfer level design, said circuit design and said layout design on said inside portions again, when said timing restrictions are not satisfied as the result of said second timing analysis.

10. An LSI design apparatus comprising:

a first section performing an arrangement wiring on a plurality of macro blocks;

a second section performing a timing analysis on said plurality of macro blocks based on the result of said arrangement wiring; and a third section designing an inside portion of each of said plurality of macro blocks based on said result of said timing analysis, further comprising:

a fourth section that determines a function specification of an LSI;

a fifth section that divides said LSI into said plurality of macro blocks based on said function specification; and a sixth section determining a size and a shape of each of said plurality of macro blocks to perform a floor plan on an entire portion of said LSI, and wherein the operations of said fourth, fifth, and sixth sections are performed before said operation of said first section is performed.

11. An LSI design apparatus according to claim 10, wherein when a predetermined timing restriction is not satisfied as the result of said operation of said second section, at least one of said operations of said fourth, fifth and sixth sections is performed again.

12. An LSI design apparatus, comprising:

a first unit performing a function specification design of an LSI;

a second unit performing an arrangement wiring on a plurality of macro blocks for said LSI based on the result of the operation of said first unit;

a third unit performing a timing analysis on said plurality of macro blocks based on the result of the operation of said second unit;

a fourth unit performing a design analysis and a wiring operation on an inside portion of each of said plurality of macro blocks based on the result of the operation of said third unit;

a fifth unit performing a arrangement operation on said plurality of macro blocks for said LSI without performing a wiring operation on said plurality of macro blocks based on the result of said operation of said first unit;

a sixth unit performing a design on an inside portion of each of said plurality of macro blocks;

a seventh unit performing a first wiring operation between said plurality of macro blocks and a second wiring operation on said inside portion of each of said plurality of macro blocks after the operations of said fifth and sixth units are performed, wherein said first and second wirings are performed at a same time to each other; and an eighth unit performing a timing analysis on said plurality of macro blocks after the operation of said seventh unit is performed, and wherein a first LSI design process unit includes said second, third and fourth units and a second LSI design process unit includes said fifth, sixth, seventh and eighth units, and one of said first and second design process units performs selectively.

* * * * *